United States Patent [19]

Aslan

[11] Patent Number: 5,168,265
[45] Date of Patent: Dec. 1, 1992

[54] PERSONAL ELECTROMAGNETIC RADIATION MONITOR

[75] Inventor: Edward E. Aslan, Plainview, N.Y.

[73] Assignee: Narda Microwave Corp., Hauppauge, N.Y.

[21] Appl. No.: 721,331

[22] Filed: Jun. 27, 1991

[51] Int. Cl.$^5$ .............................................. G08B 21/00
[52] U.S. Cl. .................................. 340/600; 250/336.1; 250/395; 250/526
[58] Field of Search ...................... 340/600; 250/336.1, 250/395, 526

[56] References Cited

U.S. PATENT DOCUMENTS 4,301,367  11/1981  Hsu ..................................... 340/600
4,489,315  12/1984  Falk et al. ........................... 340/600

Primary Examiner—Glen R. Swann, III
Attorney, Agent, or Firm—Hoffmann & Baron

[57] ABSTRACT

A personal electromagnetic radiation monitor includes an electromagnetic radiation sensor, a conductive shield spaced apart from the sensor and a backing of graduated lossy material. The electromagnetic radiation sensor includes thin film resistive thermocouples. The backing of graduated lossy material is interposed between the radiation sensor and the conductive shield. The layer is progressively more conductive through its thickness from the side which faces the sensor to the side which faces the conductive shield.

11 Claims, 5 Drawing Sheets

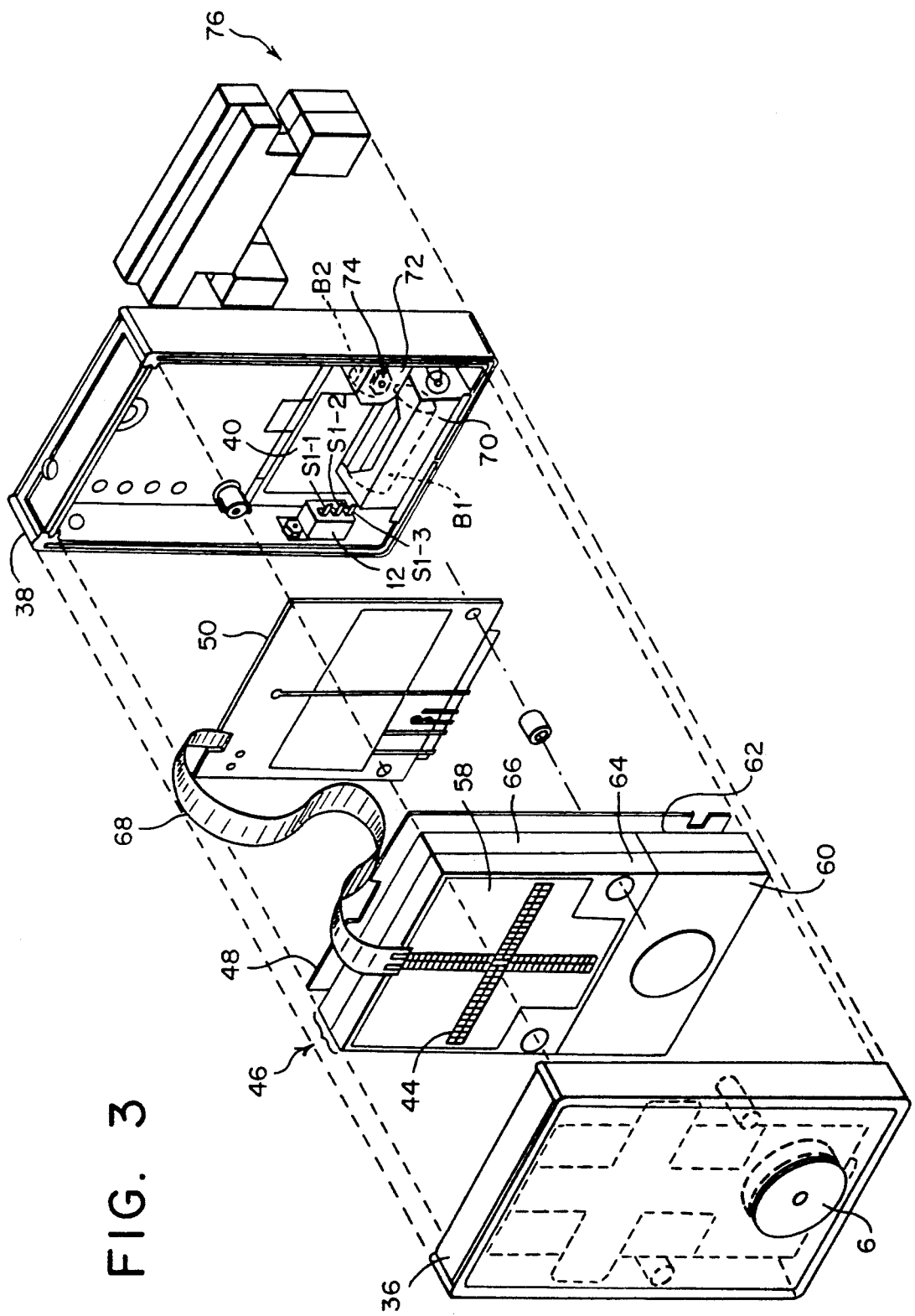

PERSONAL ELECTROMAGNETIC RADIATION MONITOR

BACKGROUND OF THE INVENTION

1. Field of the Invention

This invention relates to radiation monitors, and more specifically relates to an electromagnetic radiation monitor which may be worn by persons who may be exposed to potentially harmful levels of electromagnetic energy. Even more particularly, this invention relates to a personal electromagnetic radiation monitor which exhibits broadband frequency performance and polarization independence.

2. Description of the Prior Art

Attempts have been made to make an electromagnetic radiation monitor which may be worn by a person working in areas where potentially harmful electromagnetic radiation may be present. Early studies, such as those reported by Beischer in his article *Microwave Reflection, Diffraction and Transmission By Man*, Department of Naval Aerospace Medical Research Lab, Pensacola, Fla., Jun., 1973, have shown that scattering from a body may produce errors greater than 2 dB. This scattering becomes more significant where broadband frequency performance and independence of polarization are desired monitor characteristics. To this date, no practical device having a broadband frequency response and being independent of polarization, to the knowledge of the inventor, has been successfully marketed.

OBJECTS AND SUMMARY OF THE INVENTION

It is an object of the present invention to provide an electromagnetic radiation monitor which may be worn by persons who may be exposed to potentially harmful levels of electromagnetic energy.

It is another object of the present invention to provide a personal electromagnetic radiation monitor which exhibits broadband frequency performance and substantial independence of polarization.

It is a further object of the present invention to provide an unobtrusive, pocket-size personal electromagnetic radiation monitor which accurately detects RF radiation and sends out a warning the moment it senses that the wearer moves into a danger zone.

It is yet another object of the present invention to o provide a personal electromagnetic radiation monitor that includes an audible and visual alarm which will indicate a need to leave an area promptly.

It is still another object of the present invention to provide a personal electromagnetic radiation monitor which includes a dual battery system and a low battery warning when battery replacement is required.

It is yet a further object of the present invention to provide a personal electromagnetic radiation monitor which includes structure that allows sensitive electronic circuitry contained in the monitor to operate correctly while effectively "surrounded" by high level RF radiation, thereby producing minimal false alarms within or outside of the monitor's specified frequency range.

It is still a further object of the present invention to provide a personal electromagnetic radiation monitor whose performance is substantially unaffected due to scattering when worn by a person.

In accordance with one form of the present invention, a personal electromagnetic radiation monitor includes an electromagnetic radiation sensor, a backing of graduated lossy material and a conductive shield. The electromagnetic radiation sensor includes thin film resistive thermocouples. The radiation sensor is situated in proximity to the backing of graduated lossy material so that the backing is between the radiation sensor and one side of the conductive shield. The backing is progressively more conductive through its thickness from the front surface of the backing which faces the sensor to the back surface which faces the conductive shield.

In accordance with another aspect of the present invention, the radiation sensor, backing of lossy material and conductive shield are all mounted in a housing of the monitor. On the inside of one of the housing sides is mounted an audible alarm transducer, which transducer is situated in alignment with an opening formed through the thickness of the housing side. A first hook and loop fastener patch is mounted on the outside surface of the housing side and surrounding the opening.

The monitor further includes an electrically non-conductive ear plug assembly. The ear plug assembly has an elongated pneumatic tube having opposite ends, a pneumatic ear plug mounted on one end of the tube and a hollow housing defining an interior cavity mounted on the other end. The cavity housing has an opening formed through its thickness, and includes a second hook and loop fastener patch surrounding the opening. The second fastener patch is adapted to mate with the first fastener patch of the monitor housing to allow the cavity housing of the ear plug assembly to be mounted adjacent to the transducer. In this manner, the non-conductive ear plug assembly may be quickly and easily secured to the monitor housing so that the wearer of the monitor may use the ear plug assembly in high noise environments.

In accordance with another feature of the present invention, the monitor includes an alarm circuit and a dual battery system, and a low battery sensor. When a low battery voltage is detected on one battery, the audible alarm transducer will chirp at a predetermined interval. At an extremely low battery level, the audible alarm will emit a continuous tone. The second battery is used substantially independently of the first battery to illuminate a warning light in dangerous radiation environments. If the warning light circuit fails, the audible alarm circuit will continue to function.

In a further preferred form of the invention, the sensitive electronic circuitry of the monitor is protected from high level RF radiation by including a second section of graduated lossy material situated in the housing and at least partially surrounding the batteries of the monitor. In this way, RF energy entering the monitor will be absorbed by this second section before it is "picked up" by the battery leads between the circuitry and the battery.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 3 is an exploded view, in perspective, of a portion of the monitor shown in FIG. 1.

DETAILED DESCRIPTION OF THE PREFERRED EMBODIMENTS

Figure 2:
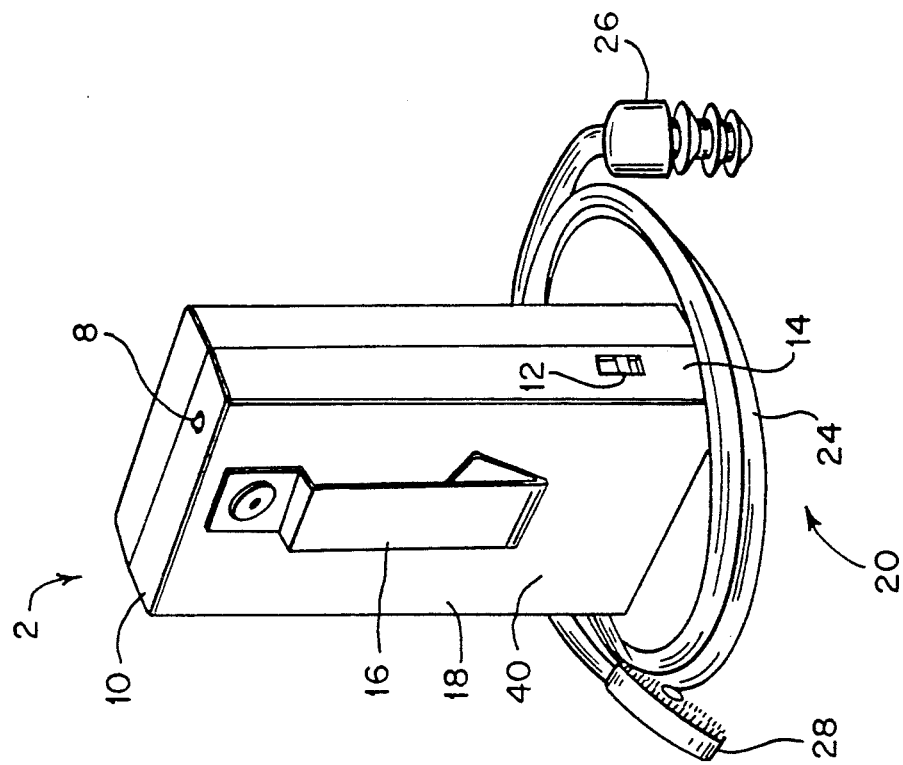
FIG. 2 is a rear perspective view of the radiation monitor of the present invention.
Figure 1:
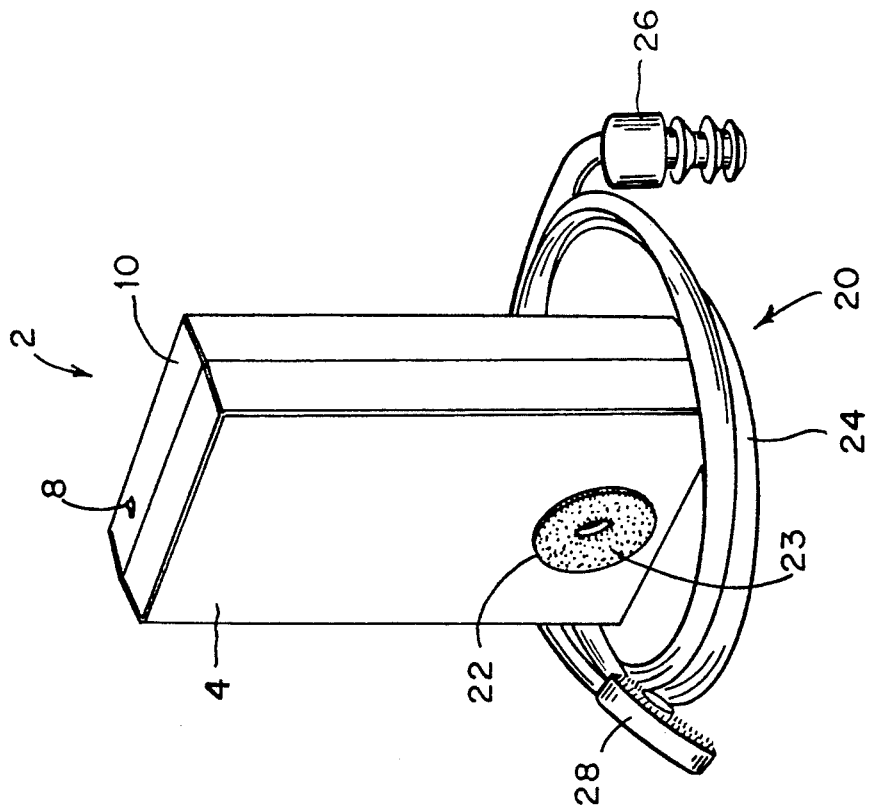
FIG. 1 is a front perspective view of a personal electromagnetic radiation monitor formed in accordance with the present invention.

Referring initially to FIGS. 1 and 2 of the drawings, it will be seen that a personal electromagnetic radiation monitor constructed in accordance with one form of the present invention includes a two piece housing 2. Mounted on the inside surface of the front wall 4 of the two piece housing is an audible alarm transducer 6 (see FIG. 3), such as a piezo ceramic transducer, which, as will be explained, provides a warning of high level RF radiation or that the battery used in the monitor is at a low voltage. During an initial turn on test, the audible alarm 6 preferably provides a one second burst. Above a preset threshold of the detected RF energy, the alarm provides a periodic nominal one second burst with the repetition rate increasing with the level of exposure. When the monitor battery is at a low voltage, the alarm 6 provides an audible chirp every forty seconds to a continuous warble (as the battery voltage drops). If the battery voltage is so low that the electromagnetic radiation sensor used in the monitor fails, the audible alarm provides a continuous tone.

The personal electromagnetic radiation monitor of the present invention further includes a visual display in the form of a light emitting diode (LED) 8. The LED 8 is mounted on the upper wall 10 of the mated housing. During an initial turn on test, the circuitry included in the monitor will illuminate the LED 8. When a predetermined amount of RF energy is detected by the monitor, the electronic circuitry will cause the LED 8 to light and the audible alarm 6 to beep, indicating a need for the wearer of the monitor to leave the area promptly.

The monitor further includes an on/off switch 12 mounted on a side wall 14 of the mated housing, as well as a resilient clip 16 mounted on the back wall 18 of the housing to allow the monitor to be carried by the wearer on his belt or shirt pocket.

Figure 5:
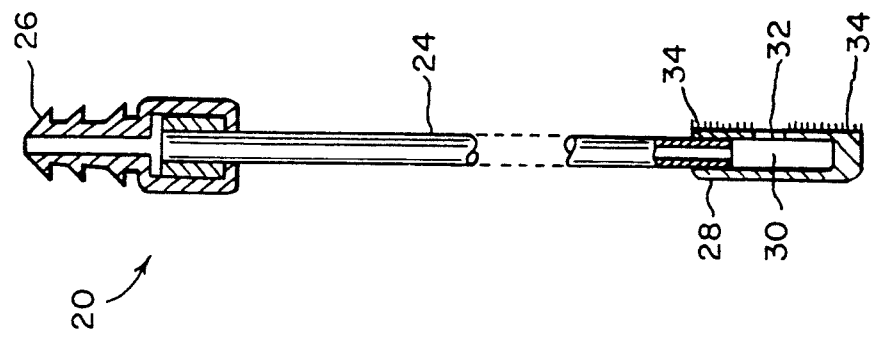
FIG. 5 is a cross-sectional view of an ear plug assembly for use with the monitor of the present invention.

The radiation monitor of the present invention also includes an ear plug assembly 20 so that the monitor may be used in high noise environments. As shown in FIGS. 1 and 5 of the drawings, a Velcro TM hook and loop fastener patch 22 is mounted on the outside surface of the housing wall 4 on which the transducer 6 is mounted and situated to surround a opening 23 formed in the wall and aligned with the transducer. The ear plug assembly 20 includes an elongated hollow tube 24. A pneumatic ear piece or ear plug 26 is mounted on one end of the tube 24, and a hollow housing 28 defining an interior cavity 30 is mounted on the other end. The cavity housing 28 has an opening 32 formed through its thickness, and includes a second hook and loop fastener patch 34 surrounding the opening 3 which is adapted to mate with the first hook and loop fastener patch 22 of the monitor housing. This will allow the cavity housing 28 to be mounted adjacent to the transducer 6 so that the tone emitted by the transducer will be carried by air pressure through the tube to the pneumatic ear plug 26.

One advantage of the ear plug assembly 20 of the present invention is that it is completely electrically non-conductive. Thus, the ear plug assembly will not pick up RF energy which might have otherwise affected the electronic circuitry of the monitor, as a conventional electrical transducer would, and further provides a safety feature in that the user of the monitor does not wear an electrically conductive device on his head, to prevent electrical shock and to prevent RF energy from being picked up by the ear plug assembly and being radiated to the wearer's head. The mating Velcro TM hook and loop fastener patches 34, 22 on the ear plug assembly and the monitor housing allow the ear plug assembly to be quickly and easily connected non-electrically to the radiation monitor.

Referring now to FIG. 3 of the drawings, it will be seen that a preferred form of the personal electromagnetic radiation monitor of the present invention includes a first housing half 36 on which is mounted the transducer 6, as mentioned previously, and a second housing half 38 which includes a battery compartment 40 and on which is mounted the on/off switch 12. Sandwiched between the housing halves is an electromagnetic radiation sensor 44, a backing of graduated lossy material 46, a conductive shield 48 which acts as a back or ground plane, and a printed circuit board 50 containing the electronic circuitry for the monitor.

Figure 4:
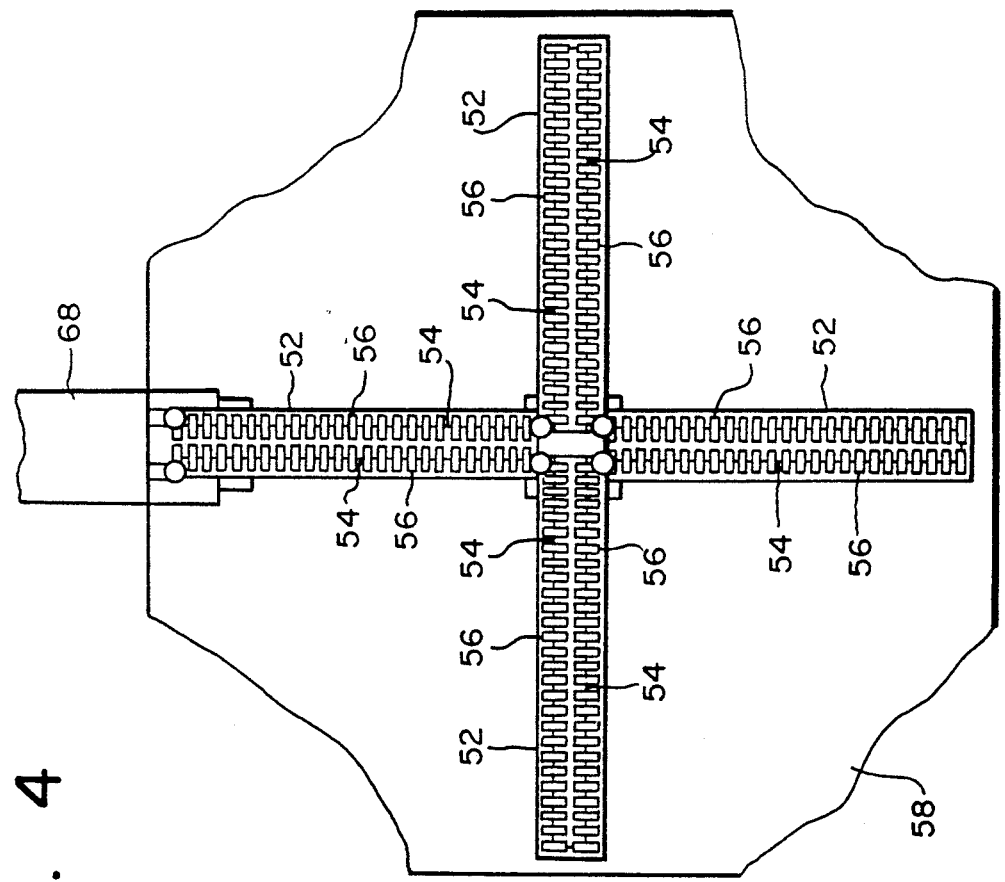
FIG. 4 is a front view of a preferred form of a radiation sensor for use in the monitor of the present invention.

The electromagnetic radiation sensor 44 preferably includes thin film resistive thermocouples. In one form of the present invention, the electromagnetic radiation sensor includes a pair of mutually orthogonally disposed antenna elements 52 residing coplanarly to each other, but more preferably includes four interconnected antenna elements 52, adjacent antenna elements being at right angles to each other, all four antenna elements 52 residing in the same plane, as shown in FIG. 4. Each antenna element 52 extends along a respective longitudinal axis, and includes an array of the thin film resistive thermocouples 54 arranged along the axis, and a plurality of spaced apart conductive elements 56 of discrete length arranged transversely to the axis of the array. Each thermocouple 54 of each antenna element is disposed between adjacent conductive elements 56. The antenna arrangement used in the radiation monitor of the present invention is very similar to that disclosed in U.S. Pat. No. 4,518,912, which issued to Edward Aslan, the disclosure of which is incorporated herein by reference.

The thin film elements function as both antenna and detector. Preferably, the hot and cold junctions of the thermocouples are separated by only a 0.5 millimeter, thereby eliminating offsets due to changes in ambient temperature, either spatial or temporal. The use of the thin film resistive thermocouples 54 in the particular arrangement described above provides broadband, true RMS detection of electromagnetic energy.

The electromagnetic radiation sensor 44 is mounted against a thin Mylar TM, or more preferably, Kapton TM spacer sheet 58. The spacer 58 is preferably about 0.005 inches in thickness, and is provided to prevent shorting of the sensor on the lossy material backing 46.

The lossy material backing 46 is graduated in resistivity. More specifically, the backing includes a front surface 60 facing the sensor 44 and an opposite back surface 62 facing the conductive shield 48. The backing is progressively more conductive through its thickness from the front surface 60 to the back surface 62. In one form of the invention, the backing may be a laminate or sandwich of two or more layers of lossy material having different resistivities, as shown in FIG. 3. Alternatively, the backing may be formed from a lossy material which is continuously more conductive through its thickness from the front surface to the back surface.

When a backing of a laminate of two layers of lossy material is used, the first layer 64 closest to the sensor is preferably a one quarter inch thick high resistivity material, and the second layer 66 closest to the conductive shield is preferably a one quarter inch thick low resistivity material. The first layer 64 preferably has a resistivity of about 15K ohms per cubic centimeter, and has a surface resistivity of approximately 20,000 ohms per square centimeter. The second layer 66 has a lower resistivity of approximately 600 ohms per cubic centimeter, and has a surface resistivity of approximately 2,000 ohms per square centimeter.

The higher resistivity surface of the lossy material backing is positioned to face the radiation sensor 44, while the lower resistance surface of the backing is positioned to face the conductive shield plate 48 such that the resistive material becomes progressively more conductive as the electric field penetrates deeper into the backing. Thus, the lossy material backing is terminated with the substantially totally reflective plate 48. The conductive shield plate 48 also provides some of the shielding for the electronic circuitry of the monitor.

The distributed resistance of the sensor 44, in combination with the sensor being mounted on the lossy material backing 46 which gradually decreases in resistivity towards the conductive shield plate, provides broadband operation. The resistance of the sensor's being large relative to the antenna reactance maintains a constant sensitivity with frequency over the operating band.

Figure 6:
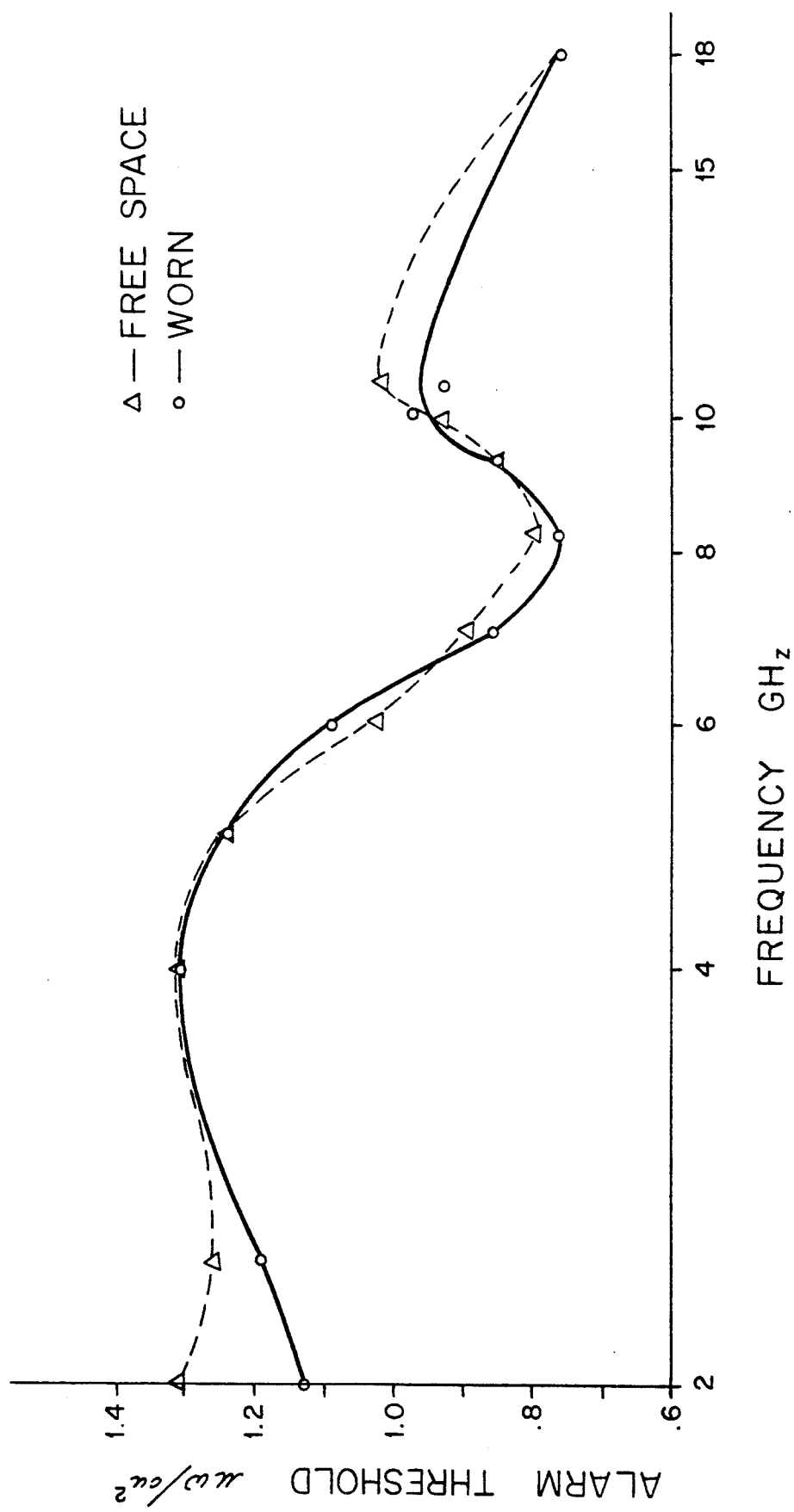
FIG. 6 is a graph illustrating the performance of the radiation monitor of the present invention over frequency in free space and when worn by a user.

FIG. 6 compares the variation in the threshold which will sound the monitor alarm over the operating frequency, which is preferably between 2 Gigahertz and 18 Gigahertz, when the monitor is worn by a user and when it is standing in free space. It is evident from the graph shown in FIG. 6 that the broadband personal monitor of the present invention is made essentially independent of its operative environment. The scattering from the wearer's body has little affect on the performance of the monitor. An essentially flat frequency response with less than ±1.5 dB variation and an independence of field perturbation due to scattering from the subject's body results from the utilization in the monitor of the thin film resistive thermocouple elements 54 mounted adjacent the graduated lossy material backing 46 which itself is backed with the conductive shield plate 48. The difference in response from when the monitor is illuminated by electromagnetic energy on a person from when it is supported in free space on a low dielectric material is less than 0.5 dB.

The radiation sensor 44 is coupled to the electronic circuitry of the monitor by using a flexible transmission line 68 consisting of at least two leads of carbon impregnated TFE material. The two leads of this transmission line 68 carry the DC output from the sensor to the electronic circuitry. These leads have a resistance of approximately 10,000 ohms per inch. The two DC leads are connected to one of the four antenna elements 52 and in particular to respective conductive elements 56 at the most outward end of the antenna element, as shown in FIG. 4 of the drawings.

Figure 7:
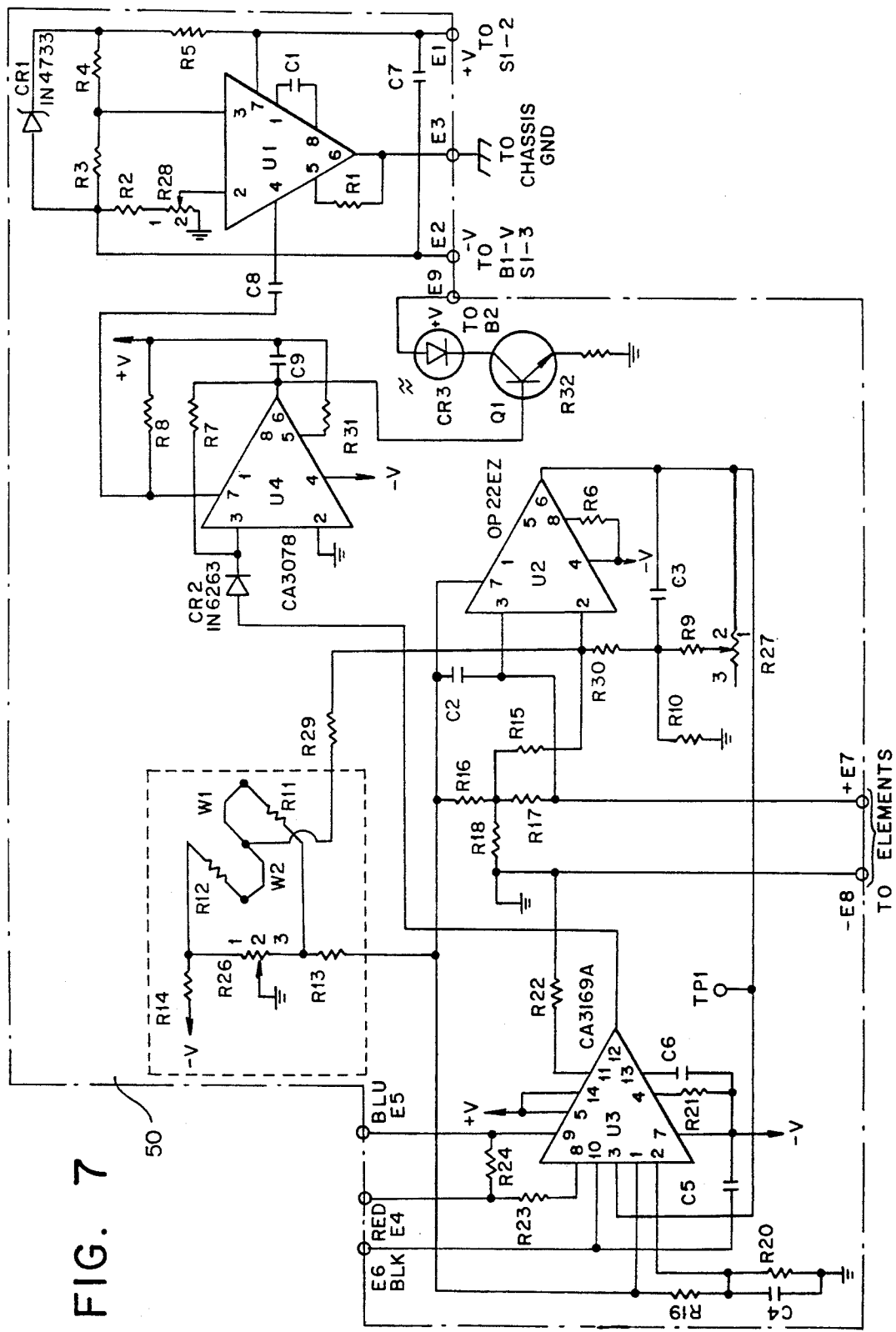
FIG. 7 is a preferred form of an electronic circuit used in conjunction with the monitor of the present invention.

FIG. 7 illustrates one form of an electronic circuit for use with the radiation monitor. Integrated circuit U1 acts as a quasi-regulated voltage source, and provides a regulated −3 volts on circuit terminal E2 (−V) and an unregulated, approximately 9 volts on circuit terminal E1 (+V). Battery B1, which is preferably a 12 volt miniature battery, is coupled across terminals E1 and E2. Diode CR1 acts as a zener diode in a starved condition and provides approximately 3 volts as a reference voltage for integrated circuit U1. Potentiometer R28 provides an adjustment of the regulated −3 volts.

Integrated circuit U4 acts as a comparator. It triggers on a positive going pulse from integrated circuit U3, as will be explained, and latches up through hysteresis (i.e., feedback resistor R7) to cause LED CR3 (which is the visual alarm LED 8) to remain illuminated. The output of circuit U4 is coupled to the base of driver transistor Q1, whose emitter is coupled to LED CR3. LED CR3 is powered by an auxiliary 3 volt battery.

Separate 12 volt and 3 volt batteries are used in the monitor to provide a fail-safe measure. Since the LED draws the most current, that is, approximately 500 milliamps, if the LED fails due to a low battery, the rest of the circuit which is powered by the 12 volt battery continues to operate to provide a warning to the user that high RF energy is present. Since the exposure light (i.e., the LED) is powered from a separate battery, maximum life is provided for the battery which powers the audible alarm. The battery for the audible alarm is envisioned to last approximately 30 days in a "sleep" mode and 6 . hours in a continuous alarm state. The exposure light will last approximately 100 hours in a continuous lighted state.

Integrated circuit U2 is a operational amplifier configured as a conditioning amplifier with a gain of approximately 1,000. Potentiometer R9 is provided as a gain adjustment. The amplifier amplifies the signal from the radiation sensor which is coupled to circuit terminals E7 and E8, and amplifies that signal before providing it to integrated circuit U3.

Resistor R10, which is coupled to one leg of potentiometer R9, is a sensitor (i.e., a thermally sensitive resistor, or thermistor) and is provided to compensate for temperature variations so that conditioning amplifier U2 will provide more or less gain, as needed, as the temperature varies.

Integrated circuit U3 is a conventional circuit used in smoke detectors. Smoke detector circuit U3 provides a regulated voltage on its pin 1 which, in the case of the monitor circuit, is a 3 volt reference voltage to ground. Resistors R19 and R20 comprise a resistor network which provides a 1 volt alarm threshold on pin 2 of circuit U3. A standard piezo electric transducer 6 is coupled through terminals E4, E5 and E6 to pin numbers 8, 9 and 10 of circuit U3. A suitable transducer which may be used is Part No. PKM 11-6A0 manufactured by Murata-Erie Co.

The resistor circuit shown in dashed line A, in conjunction with potentiometer R26, provides an adjustment to correct the offset bias of conditioning amplifier U2.

The circuit of the radiation monitor of the present invention operates in the following manner. The radiation sensor 44 generates 1 millivolt per 1 milliwatt per square centimeter of RF energy which illuminates it.

This signal is carried by the transmission line 68 described previously to the inputs of conditioning amplifier U2. U2 amplifies the 1 millivolt signal from the radiation sensor (that is, when the sensor is illuminated with 1 milliwatt per square centimeter of energy) by 1,000 to provide an output signal which is approximately 1 volt. The 1 volt signal is provided to pin 3 of the smoke detector circuit U3. If the amplified signal from conditioning amplifier U2 is greater than the 1 volt threshold on pin 2 of circuit U3, the output of circuit U3 at pin 12 will provide a positive going pulse through diode CR2 to the non-inverting input (pin 3) of comparator U4.

In response to this pulse, the output of comparator U4, at pin 6, will go to a positive voltage and bias transistor Q1 on. Transistor Q1 will conduct current through LED CR3 to illuminate the LED of the radiation monitor. Hysteresis will keep comparator U4 latched until the circuit is reset.

Also, smoke detector circuit U3 sounds the piezo electric alarm 6 (FIG. 3) when the threshold is exceeded. Circuit U3 further monitors the battery voltage. When the battery voltage drops to approximately 7.5 volts, circuit U3 will cause the alarm to emit a chirp every 40 seconds. If the battery drops further in voltage, the chirps emitted by the alarm will become more frequent until a battery voltage is reached which causes the alarm to emit a continuous warble tone.

The monitor of the present invention further provides a self-test upon turn on. Capacitor C2, which is connected between the input (pin 3) of the conditioning amplifier U2 and the regulated 3 volt output of circuit U3 (at pin 1), is initially uncharged, thus providing a test voltage to be applied to the inputs (pins 3 and 2) of conditioning amplifier U2 through the resistor divider network comprised of resistors R16 and R17 and the input resistor R15. This test voltage is approximately 1 millivolt, which is comparable to the voltage which would be provided by the radiation sensor when the sensor is illuminated with RF energy of 1 milliwatt per square centimeter. The test voltage is amplified by circuit U2, and smoke detector circuit U3 sounds the alarm and causes comparator U4 to go to a positive state on its output, thereby turning on transistor Q1 and illuminating LED CR3. Comparator U4 is not latched under these test conditions. This is because capacitor C8, which is coupled between the regulated −3 volts and the positive supply voltage input (pin 7) of comparator U4 and one side of resistor R8 whose other side is connected to the unregulated 9 volt supply, is initially uncharged. Capacitor C8 prevents the positive supply voltage from being supplied to pin 7 of comparator U4. Circuit U4 will not latch up through hysteresis feedback resistor R7 under these conditions until capacitor C8 has become charged. At that time, however, capacitor C2 has become fully charged and effectively removes the test voltage from the inputs of conditioning amplifier U2. The output of amplifier U2 thereby falls below the 1 volt threshold, and the output signal from circuit U3 returns to a low level. This, in turn, causes the output signal of comparator U4 to return to a low logic level, thereby cutting off transistor Q1 and turning off warning LED CR3.

To ensure that the various capacitors and other components in the electronic circuitry of the monitor are fully discharged when the monitor is shut off, which thereby prevents false alarms as well as prevents comparator U4 from latching, a single pole, double throw switch is used as the on/off switch 12. The positive side of battery B1 is coupled to one pole (S1-1) (FIG. 3) of the switch. The wiper terminal (S1-2) (FIG. 3) of the switch is coupled to the E1 terminal of the electronic circuit board. The E2 terminal is connected directly to the negative terminal of the battery and to the other pole (S1-3) (FIG. 3) of the switch. Accordingly, when the switch 12 is in the on position, Wiper S1-2 contacts pole S1-1 to provide voltage from battery B1 across terminals E1 and E2. When the switch is in the off position, wiper S1-2 contacts the opposite pole S1-3 and provides a short circuit across terminals E1 and E2. Because transistor Q1 remains cut off, when LED CR3 is not illuminated, negligible current is drawn from battery B2 when the monitor is off.

A parts list for the circuit shown in FIG. 7 is provided below. Also, the pin numbers shown in FIG. 7 for integrated circuits U1–U4 relate to the parts specified in the list although, of course, it is envisioned that components comparable to those listed below, connected differently from that shown in FIG. 7, may be suitable for use.

| PARTS LIST FOR CIRCUIT SHOWN IN FIG. 7 | |
|---|---|
| Part Description | Reference Designation |
| TRANSISTOR 2N4124 | Q1 |
| WIRE, BUSS | W1-2 |
| CAPACITOR 22 uf | C7-8 |
| CAPACITOR .1 uf | C2, C3, C6 |
| CAPACITOR .01 uf | C4, C5 |
| CAPACITOR .001 uf | C1 |
| LIGHT EMITTING DIODE | CR3 |
| DIODE | CR2 |
| ZENER DIODE | CR1 |
| IC CHIP - CA3169A | U3 |
| IC CHIP - CA3078 | U1, U4 |
| IC CHIP - OP22EZ | U2 |
| CAPACITOR 1 uf | C9 |
| POTENTIOMETER 1 MEG OHMS | R27, R28 |
| POTENTIOMETER 10K OHMS | R26 |
| RESISTOR 2.4K OHMS | R32 |
| RESISTOR 360K OHMS | R9 |
| RESISTOR 62 OHMS | R23 |
| RESISTOR 3 MEG OHMS | R15, 22 |
| RESISTOR 200K OHMS | R8, 18 |
| RESISTOR 20 MEG OHMS | R17, 31 |
| RESISTOR 6.2 MEG OHMS | R16 |
| RESISTOR 510K OHMS | R13-14, R20 |
| RESISTOR 10K OHMS | R9, R11, R12 |
| SENSITOR 680 OHMS | R10 |
| RESISTOR 2 MEG OHMS | R7 |
| RESISTOR 3.3 MEG OHMS | R6 |
| RESISTOR 5.1 MEG OHMS | R21 |
| RESISTOR 820K OHMS | R2, R5 |
| RESISTOR 1 MEG OHMS | R1, 3, 4, 19, 29 |
| RESISTOR 100K OHMS | R24 |
| RESISTOR 51K OHMS | R30 |

Battery B1 is a 12 volt miniature battery and is received by a receptacle 70 mounted in a battery compartment 40 of the housing. Battery B2, in one form of the invention, is comprised of a pair of 1.5 volt button batteries connected in series and mounted in a separate receptacle 72 containing a spring 74 for biasing the batteries against contacts in the housing.

To further ensure that no RF energy affects the performance of the monitor, the battery compartment 40 which houses batteries B1 and B2 is provided with additional lossy material 76 so that the receptacles 70, 72 which receive batteries B1 and B2, respectively, are at least partially surrounded by the material. The material 76 is preferably progressively more conductive through its thickness from the back wall 18 of the housing to the conductive shield plate 48, as with the lossy material backing 46 described previously.

The radiation monitor of the present invention accurately detects RF radiation without being affected by body scattering caused by the wearer's body. Its compact size allows it to be worn on a belt using the clip 16 (FIG. 2) provided or in the wearer's pocket. Its broadband frequency performance and independence of polarization make the monitor perfectly adaptable for use in a variety of RF environments. The audible alarm 6 provides a warning of RF exposure, and the LED 8 provides a visual indication as well. The LED latches so as to provide a record that the wearer was exposed to RF energy, in the event the wearer did not hear the audible alarm before he left the danger zone.

The personal electromagnetic radiation monitor of the present invention is further quite suitable for use in high ambient noise environments. The ear plug assembly 20 includes ear plugs which may be used in conjunction with ear phones, and is non-electrically conductive to prevent injury to the wearer and misreadings or damage to the electronic circuitry of the monitor. The Velcro TM hook and loop fastener patches used on the ear plug assembly and the housing of the monitor allows the user to quickly and easily connect the ear plug assembly to the transducer on the housing with no electrical connection required.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A personal electromagnetic radiation monitor, which comprises:
   an electromagnetic radiation sensor;
   a conductive shield spaced apart from the sensor; and
   a backing of graduated lossy material, the backing being interposed between the radiation sensor and the conductive shield and having a front surface facing the sensor and an opposite back surface facing the conductive shield, the layer being progressively more conductive through the thickness thereof from the front surface to the back surface.

2. A personal electromagnetic radiation monitor as defined by claim 1, wherein the electromagnetic radiation sensor includes a pair of mutually orthogonally disposed antenna elements residing coplanarly to each other, each antenna element extending along a respective longitudinal axis and including an array of thin film resistive thermocouples arranged along the axis, and a plurality of spaced apart conductive elements of discrete length arranged transversely to the axis of the array, each thermocouple of each antenna element being disposed between adjacent conductive elements.

3. A personal electromagnetic radiation monitor as defined by claim 1, which further includes a sheet of insulating material interposed between the sensor and the backing of graduated lossy material.

4. A personal electromagnetic radiation monitor as defined by claim 1, wherein the backing of graduated lossy material comprises a laminate formed from at least first and second layers of lossy material having different resistivities, the first layer having a higher resistivity than the second layer, the backing being situated such that the higher resistance first layer is situated closer to the sensor than the lower resistance second layer.

5. A personal electromagnetic radiation monitor as defined by claim 1, wherein the backing is formed from a lossy material which is continuously more conductive through the thickness thereof from the front surface to the back surface.

6. A personal electromagnetic radiation monitor as defined by claim 1, which further includes a housing, the sensor, backing of graduated lossy material and conductive shield being mounted in the housing.

7. A personal electromagnetic radiation monitor as defined by claim 6, wherein the housing includes at least one side having an outer surface; wherein the monitor further includes an audible alarm transducer which is mounted on the housing side; wherein the housing includes a hook and loop fastener patch mounted on the outer surface of the housing side and positioned in proximity to the transducer; and wherein the monitor further includes an electrically non-conductive ear plug assembly, the ear plug assembly including an elongated pneumatic tube having opposite first and second ends, a pneumatic ear plug mounted on the first end of the tube and a hollow housing defining an interior cavity mounted on the second end of the tube, the cavity housing having an opening formed through the thickness thereof and including a second hook and loop fastener patch surrounding the opening and which is adapted to mate with the first hook and loop fastener patch of the monitor housing to allow the cavity housing to be mounted adjacent to the transducer, the ear plug being in communication with the transducer through the pneumatic tube, cavity and opening when the cavity housing is mounted adjacent to the transducer.

8. A personal electromagnetic radiation monitor as defined by claim 6, wherein the conductor shield has opposite first and second sides, the lossy material backing being mounted adjacent to the first side of the shield; and wherein the monitor further comprises an alarm circuit, the alarm circuit being mounted in the housing on the second side of the shield.

9. A personal electromagnetic radiation monitor as defined by claim 8, wherein the housing defines a battery compartment situated on the second side of the shield; and wherein the monitor further includes a battery receptacle situated in the battery compartment, and a second layer of graduated lossy material situated in the compartment and at least partially surrounding the battery receptacle.

10. A personal electromagnetic radiation monitor as defined by claim 9, wherein the monitor further comprises a latching circuit and a light mounted on the housing, the latching circuit being coupled to the alarm circuit and to the light, the latching circuit causing the light to illuminate when a predetermined level of radiation is detected by the sensor, and further causing the light to remain illuminated when the radiation detected by the sensor falls below the predetermined level.

11. A personal electromagnetic radiation monitor, which comprises:
   an electromagnetic radiation sensor, the electromagnetic radiation sensor including a pair of mutually orthogonally disposed antenna elements residing coplanarly to each other, each antenna element extending along a respective longitudinal axis and including an array of thin film resistive thermocouples arranged along the axis, and a plurality of spaced apart conductive elements of discrete length arranged transversely to the axis of the array, each thermocouple of each antenna element being disposed between adjacent conductive elements;

a conductive shield spaced apart from the sensor, the conductive shield having opposite first and second sides;

a backing of graduated lossy material, the backing being interposed between the radiation sensor and the conductive shield and having a front surface facing the sensor and an opposite back surface facing the first side of the conductive shield, the backing being progressively more conductive through the thickness thereof from the front surface to the back surface;

a housing, the sensor, backing of graduated lossy material and conductive shield being mounted in the housing, the housing including at least one side having an outer surface;

an audible alarm transducer mounted on the housing side, the housing including a hook and loop fastener patch mounted on the outer surface of the housing side and positioned in proximity to the transducer;

an electrically non-conductive ear plug assembly, the ear plug assembly including an elongated pneumatic tube having opposite first and second ends, a pneumatic ear plug mounted on the first end of the tube and a hollow housing defining an interior cavity mounted on the second end of the tube, the cavity housing having an opening formed through the thickness thereof and including a second hook and loop fastening patch surrounding the opening which is adapted to mate with the first hook and loop fastener patch of the monitor housing to allow the cavity housing to be mounted adjacent to the transducer, the ear plug being in communication with the transducer through the pneumatic tube, cavity and opening when the cavity housing is mounted adjacent to the transducer;

a warning light mounted on the housing; and an alarm circuit and a latching circuit, the alarm circuit and the latching circuit being mounted in the housing adjacent to the second side of the shield, the alarm circuit being connected to the transducer and being adapted to cause the transducer to emit an audible sound when a predetermined level of radiation is detected by the sensor, the latching circuit causing the light to illuminate when the predetermined level of radiation is detected by the sensor, and further causing the light to remain illuminated when the radiation detected by the sensor decreases in magnitude to below the predetermined level;

the housing defining a battery compartment situated on the second side of the shield, the monitor further including a battery receptacle and a second backing of graduated lossy material situated in the compartment and at least partially surrounding the battery receptacle.

* * * * *